United States Patent

Lips

[11] Patent Number: 5,910,683
[45] Date of Patent: Jun. 8, 1999

[54] POWER SEMICONDUCTOR MODULE

[75] Inventor: Hans-Peter Lips, Adelsdorf, Germany

[73] Assignee: Siemens Aktiengesellschaft, Munich, Germany

[21] Appl. No.: 09/000,131

[22] PCT Filed: Jul. 8, 1996

[86] PCT No.: PCT/DE96/01228

§ 371 Date: May 11, 1998

§ 102(e) Date: May 11, 1998

[87] PCT Pub. No.: WO97/04518

PCT Pub. Date: Feb. 6, 1997

[30] Foreign Application Priority Data

Jul. 17, 1995 [DE] Germany ................ 295 11 510 U

[51] Int. Cl.⁶ .................................................. H01L 23/34
[52] U.S. Cl. .................... 257/723; 257/724; 257/107; 257/713; 257/787
[58] Field of Search ................................ 257/723, 724, 257/107, 713, 787

[56] References Cited

U.S. PATENT DOCUMENTS

| 5,297,001 | 3/1994 | Sterling. | |
|---|---|---|---|
| 5,559,374 | 9/1996 | Ohta et al. | 257/724 |
| 5,747,875 | 5/1998 | Oshima | 257/724 |
| 5,811,878 | 9/1998 | Harmoinen et al. . | |
| 5,825,085 | 10/1998 | Masumoto et al. | 257/723 |

*Primary Examiner*—Edward Wojciechowicz
*Assistant Examiner*—S. V. Clark
*Attorney, Agent, or Firm*—Kenyon & Kenyon

[57] ABSTRACT

The invention relates to a power semiconductor module having at least one power semiconductor switch, a cooling system, control electronics and a relieving network. According to this invention, these components are cast with an insulating medium to form a solid block, with the connections of the power semiconductor switch, the control equipment and the cooling system projecting out of the block. This yields a compact power semiconductor module which can be installed in an outdoor framework structure and is encapsulated to insulate it against environmental influences.

9 Claims, 1 Drawing Sheet

POWER SEMICONDUCTOR MODULE

FIELD OF THE INVENTION

The present invention is directed to a power semiconductor module having at least one power semiconductor switch, a cooling system, control electronics, and a relieving network.

BACKGROUND INFORMATION

In high-voltage applications in power electronics, such as high-voltage d.c. transmission (HVDCT), static var compensation (SVC), and high-voltage variable-speed drives, a plurality of power semiconductors with their cooling systems, control electronics, and relieving networks are usually connected electrically in series to achieve adequate dielectric strength. The combination of power semiconductors and their associated cooling systems, control electronics, and relieving networks is known as a thyristor station. A plurality of such thyristor stations are combined mechanically in one module, and the design of the module must meet certain mechanical requirements and other requirements regarding the electric insulation of the components.

Such a module is described in the journal *IEEE Transactions on Power Apparatus and Systems*, vol. PAS-94, no. 3, May/June 1975, pages 1061–1071, and from the two embodiments of low and high direct voltage discussed in the Siemens brochure "High-voltage direct-current transmission (HVDCT)," order no. E50001-U131-A35, imprint PA 3942.

The article cited above concerns a high-voltage direct-current transmission system (HVDCT system) whose valves of one phase are arranged in an oil tank. These oil tanks are set up outdoors. Each valve comprises up to twenty power semiconductor modules. Also described are a relieving network, a block diagram of a control circuit, and the tank arrangement. The tank with its oil filling assumes the function of electrically insulating the thyristor stations with respect to the mechanical construction of the modules and the entire valve, and shielding all components from environmental influences.

In the conference contribution with the title "State-of-the-Art Thyristor Valves for China's First HVDC Transmission System" of the IEEE/CSEE Joint Conference on High Voltage Transmission Systems in China, Beijing, Oct. 17–22, 1987, pages 520–528, a high-voltage direct-current transmission system is proposed using water-cooled valves that are accommodated by suspension in a structure. This conference contribution describes the design of a modular unit. In addition, the control electronics of a power semiconductor and the valve-base electronics for optical transmission of control pulses are described.

The Siemens brochure "Advanced Series Compensation," order no. E50001-U132-A22-X-7600, imprint PA 1932, describes another embodiment of an arrangement of power semiconductor modules in which the modules switch capacitors and are arranged in a special walk-in container on an insulated platform together with the capacitors and reactance coils of a series reactive-power compensation system.

Certain technical problems stem from the electrical insulation of thyristor stations. These problems arise when several thyristor stations are connected electrically in series to achieve a high dielectric strength. Additional technical problems also arise with respect to measures intended to protect against environmental influences. In these measures, converters are arranged in framework structures and are accommodated with air insulation in a special structure, container or cabinet, or they are arranged in tanks filled with air or an insulating liquid. These embodiments have the disadvantage that relatively expensive structures are required even for low-power converters, and these often require complicated approval proceedings. Another problem is that the tank that is filled with insulating fluid or gas must be opened to replace individual defective components. Such replacement operations can be very labor-intensive.

SUMMARY OF THE INVENTION

An object of the present invention is to provide an improved thyristor station that overcomes in a cost-efficient manner the aforementioned disadvantages of known thyristor stations.

In particular, this object is achieved by using components that are cast with an insulating medium to form a solid block, with the connections of the power semiconductor, the control electronics, and the cooling system projecting out of the block. By manufacturing thyristor stations in this manner, it is now possible to arrange and wire their modular blocks in an outdoor framework structure or to allocate them directly to individual capacitor banks when capacitors are connected. This eliminates the need for a building or container or cabinet or tank. If there are defects in individual components of a modular block, this modular block is replaced.

When light pulse firing power semiconductors are directly used as power semiconductors, the advantages of the present invention become apparent because the need to use control electronics with numerous electronic components is eliminated. This in turn reduces the probability of failure while at the same time yielding modules that are especially compact.

Another advantage of the power semiconductor module according to the present invention is that the need to incorporate special measures for air pollution abatement, which are required with today's air-insulated designs, is eliminated. The insulating casting compound encapsulates the components of the power semiconductor module, isolating it from the environment, so that there is no contamination of the components which would be responsible for corona effects or partial discharge and electric sparkovers.

DETAILED DESCRIPTION

Figure 1:
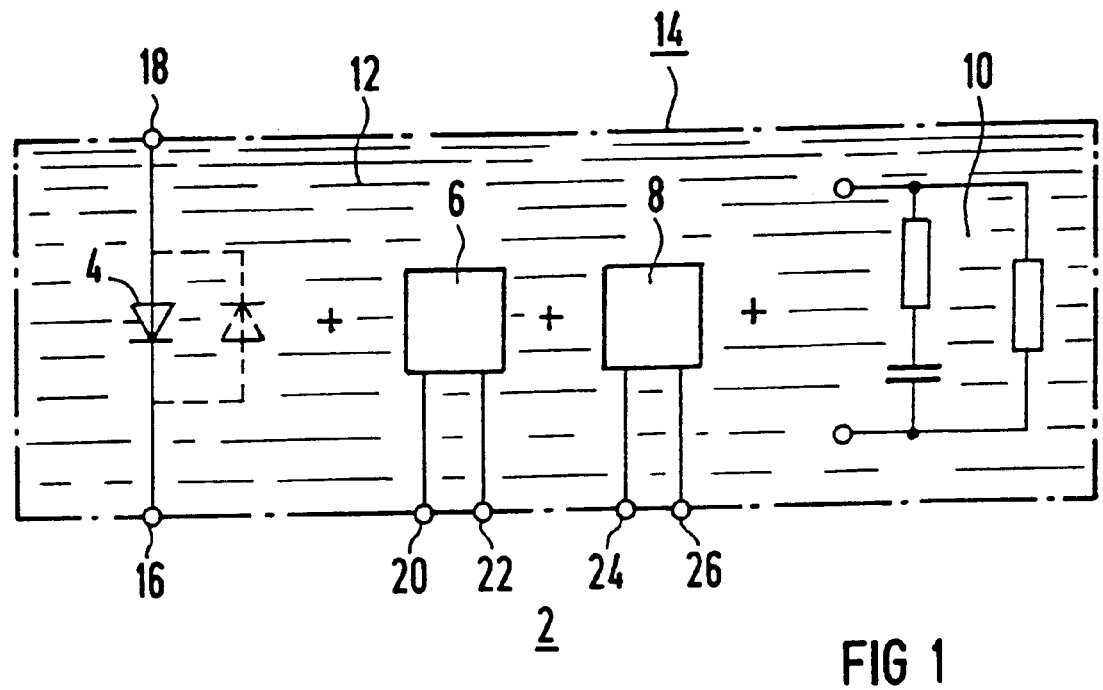
FIG. 1 is a simplified diagram of a power semiconductor module according to the present invention.

As shown in FIG. 1, power semiconductor module 2 contains at least one power semiconductor switch 4, e.g., a thyristor. Accompanying power semiconductor switch 4 are control electronics 6, which are also referred to as thyristor electronics, a cooling system 8, and a relieving network 10. Thyristor electronics 6 and relieving network 10 may correspond, for example, to any suitable thyristor electronics or relieving networks, such as those discussed in the above-mentioned references. Cooling system 8 may comprise, for example, at least one cooling case, a clamping fixture, and several coolant lines. These components 4, 6, 8, and 10 of the power semiconductor module 2 are linked electrically and mechanically. This component set is cast with an insulating medium 12 to form a solid block 14. The following connections extend out of this cast block 14: power supply terminals 16, 18, gate terminals 20, 22, and coolant connections 24, 26. Components 4, 6, 8 and 10 of the power semiconductor module 2 are encapsulated and isolated from the environment by the casting compound, so that components 4, 6, 8 and 10 are no longer exposed to environmental influences. Plastic, for example, may be used as the insulating medium 12, and epoxy resin imparts the required rigidity to the block.

Figure 2:
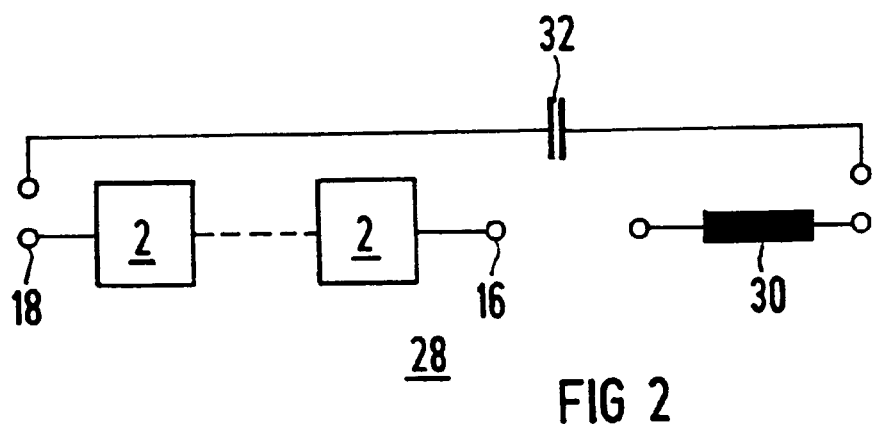
FIG. 2 is a simplified diagram of a power semiconductor valve module.

A plurality of the power semiconductor modules 2 according to FIG. 1, each of which can be referred to as a thyristor station, are combined to form one power semiconductor valve module 28, as shown in FIG. 2. The power semiconductor valve module 28 is also referred to as a valve section. In addition to thyristor stations 2, the valve section 28 includes a saturable valve reactor 30 and a capacitor 32. Thyristor stations 2 and saturable valve reactor 30 are connected electrically in series, whereas capacitor 32 is connected electrically in parallel with this series connection. At least one such valve module 28 is used for a valve of a multipulse converter, for example.

This embodiment of the power semiconductor module 2 of the present invention allows them to be placed in an outdoor framework structure and connected electrically to one another according to a wiring diagram of a converter. This converter design thus resembles that of a capacitor bank where the capacitors are inserted into an outdoor framework structure. As a result, it is not necessary to have a special building, valve bay or vessel, so converters of a lower power level in particular are much less expensive.

If, instead of power semiconductor switch 4, a directly light pulse firing power semiconductor is used, this eliminates thyristor electronics 6. As a consequence, the amount of electronic components in the system is reduced. The use of a directly light pulse firing power semiconductor thus results in a module 2 that is even more compact and inexpensive.

The power semiconductor module 2 according to the present invention can also be used with a high-voltage capacitor bank comprising a plurality of capacitors. These capacitors are arranged in an outdoor framework structure. A power semiconductor module 2 can be connected electrically in parallel with these capacitors and/or several capacitors may be connected in series. These power semiconductor modules 2 are also arranged in an outdoor framework structure. This yields a compact, variable high-voltage capacitor bank. Instead of capacitors, reactor units of a reactor unit can also be combined with power semiconductor modules 2, if a compact variable reactor arrangement is needed. Since modules 2 can be arranged in an outdoor framework structure, what results is a compact embodiment of a high-voltage capacitor bank or reactor arrangement.

What is claimed is:

1. A power semiconductor module comprising:
    a relieving network;
    at least one power semiconductor switch having a first supply terminal and a second supply terminal;
    a control electronics device coupled to the power semiconductor switch and having a first gate terminal and a second gate terminal; and
    a cooling system coupled to the control electronics device and having a first coolant connection and a second coolant connection,
    wherein the relieving network, the power semiconductor switch, the control electronics device, and the cooling system are cast within an insulating medium forming a solid block, and wherein the first and second supply terminals, the first and second gate terminals, and the first and second coolant connections project out from the block.

2. The power semiconductor module according to claim 1, wherein the insulating medium comprises plastic.

3. The power semiconductor module according to claim 2, wherein the plastic comprises an epoxy resin.

4. The power semiconductor module according to claim 1, wherein the cooling system comprises at least one cooling case, a clamping fixture, and at least one coolant line.

5. The power semiconductor module according to claim 1, wherein the power semiconductor switch is activated electrically.

6. The power semiconductor module according to claim 1, wherein the power semiconductor switch is activated by a series of light pulses.

7. The power semiconductor module according to claim 1, wherein the power semiconductor switch is an interruptible power semiconductor switch.

8. A power semiconductor valve module, comprising:
    at least one power semiconductor module, wherein the power semiconductor module comprises:
        a relieving network;
        at least one power semiconductor switch having a first supply terminal and a second supply terminal,
        a control electronics device coupled to the power semiconductor switch and having a first gate terminal and a second gate terminal, and
        a cooling system coupled to the control electronics device and having a first coolant connection and a second coolant connection,
    wherein the relieving network, the power semiconductor switch, the control electronics device, and the cooling system are cast within an insulating medium forming a solid block, and wherein the first and second supply terminals, the first and second gate terminals, and the first and second coolant connections project out from the block;
    a nonlinear valve reactor forming a series connection with the power semiconductor module; and
    a capacitor connected in parallel with the series connection.

9. The power semiconductor valve module according to claim 8, wherein the series connection includes at least two power semiconductor modules connected in series.

* * * * *